United States Patent [19]

Watanabe et al.

[11] Patent Number: 5,434,926
[45] Date of Patent: Jul. 18, 1995

[54] AUTOMATIC SOUND VOLUME CONTROL METHOD

[75] Inventors: Yoshikatsu Watanabe; Takashi Miyake; Masatoshi Ito; Yoshio Imanishi, all of Iwaki, Japan

[73] Assignee: Alpine Electronics Inc., Tokyo, Japan

[21] Appl. No.: 15,108

[22] Filed: Feb. 9, 1993

[30] Foreign Application Priority Data

Feb. 17, 1992 [JP] Japan .................... 4-29287

[51] Int. Cl.⁶ .............................................. H03G 3/00
[52] U.S. Cl. ..................................... 381/108; 381/86
[58] Field of Search .................. 381/101, 102, 98, 103, 381/86, 99, 104, 106, 107, 108, 109

[56] References Cited

U.S. PATENT DOCUMENTS

| | | | |
|---|---|---|---|
| 4,610,024 | 9/1986 | Schulhof | 381/103 |
| 4,641,361 | 2/1987 | Rosback | 381/102 |
| 4,852,176 | 7/1989 | Truke, Jr. | 381/103 |
| 5,107,539 | 4/1992 | Kato et al. | |
| 5,172,417 | 12/1992 | Iwamura | 381/103 |
| 5,204,971 | 4/1993 | Takahashi et al. | 381/86 |

FOREIGN PATENT DOCUMENTS

4020111 1/1992 Japan ....................... 381/101

*Primary Examiner*—Curtis Kuntz
*Assistant Examiner*—Ping W. Lee
*Attorney, Agent, or Firm*—Guy W. Shoup; Norman R. Klivans; Patrick T. Bever

[57] ABSTRACT

An automatic volume control to prevent the listener from having an odd sensation is obtained with a plurality of conditions taken into considerations. A plurality of control rules required to infer using fuzzy logic a volume correcting value on the basis of frequency band component levels, L, M and H and a volume level V are stored beforehand in a volume correcting value inferring portion 13. The volume correcting value inferring portion 13 obtains inference results of the individual control rules on the basis of the individual frequency band component levels L, M, H input from a filter circuit 12 and the volume level input from an audio reproducing portion 14, obtains a weighted mean of the respective inference results as a volume correcting value Z, and inputs the volume correcting value to the audio reproducing portion 14 to automatically correct the volume. Furthermore, since a degree with which each of the control rules is associated with volume correction differs, an adjustment coefficient corresponding to each of the degrees is stored beforehand. A weighted mean of the values obtained by multiplying the inference results of the control rules by the corresponding adjustment coefficients is the volume correcting value.

11 Claims, 8 Drawing Sheets

AUTOMATIC SOUND VOLUME CONTROL METHOD

BACKGROUND OF THE INVENTION

1. Field of the Invention

The present invention relates to an automatic sound volume correction method and apparatus for use in audio equipment for vehicles, and more particularly, to an automatic sound volume correction method in which the volume correcting value thereof is inferred by fuzzy (logic) control.

2. Description of the Related Art

Unlike the inside of a house, the inside of a vehicle is full of noise, such as engine or air sound. The level of such noise changes with the running speed or location. Thus, when the driver or passenger listens to a radio broadcast or the reproduced sound of a cassette tape or a compact disk, he or she sets the volume according to the noise level. That is, when the noise level is high, he turns up the volume as compared to when the vehicle is running in a quiet state. As mentioned above, the noise level changes with the running speed or location. Therefore, the driver must adjust the volume according to the noise level, which is troublesome and undesirable from the viewpoint of safe driving.

Figure 8:
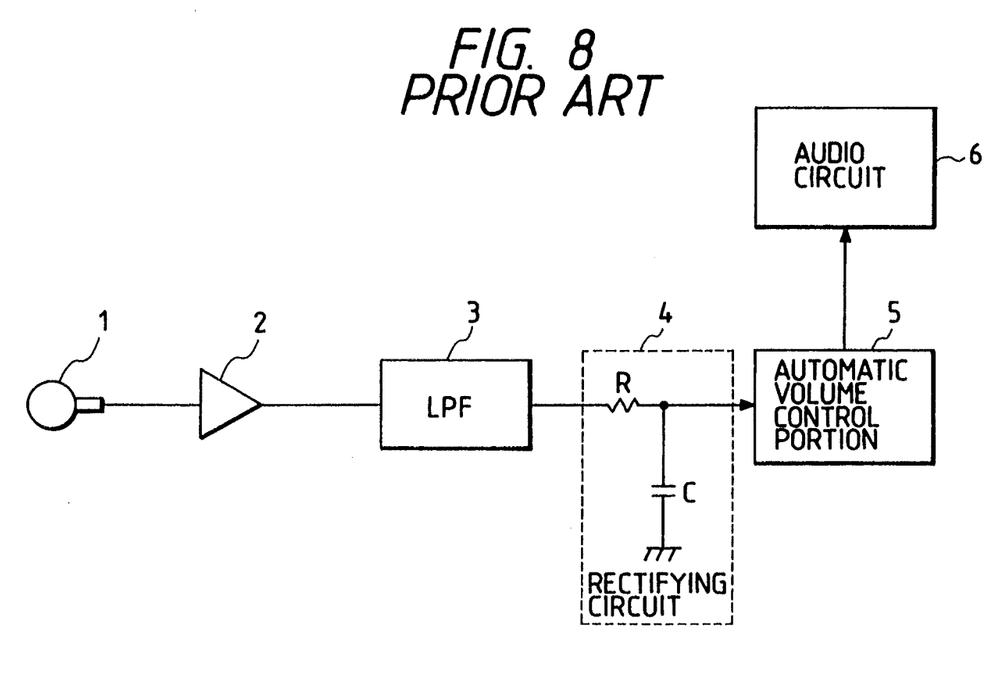
FIG. 8 illustrates a conventional automatic volume control device.

Accordingly, it has been proposed to automatically correct the volume using a detected low-frequency noise level. FIG. 8 shows the structure of such a conventional automatic sound volume system. Reference numeral 1 denotes a microphone for detecting sound waves in a vehicle; 2 denotes an amplifier for amplifying the detected sound signal; 3 denotes a low-pass filter for detecting a low frequency band component at 50 Hz or below contained in the detected sound; 4 denotes a rectifying circuit including resistor R and capacitor C; 5 denotes an automatic volume control portion which is a microcomputer; and 6 denotes audio equipment. The automatic volume control portion 5 determines a volume correcting quantity according to the level of a low-frequency band component, and inputs the determined value to the audio circuit 6 to control an electronic volume (not shown). That is, when the level of the low frequency band component is high, it is determined that the noise level is high and then the volume correcting quantity is increased to turn up the volume. When the level of the low frequency band component is low, it is determined that the noise level is low and the volume correcting quantity is reduced.

Generally, a high level low-frequency band component signifies a high noise level. However, this is not always true: the level may change due to vibrations of the vehicle or the like. Also, the frequency band which is noisy and offensive to the ears of a human being is not a low frequency band of 50 Hz or below; a noise having an intermediate frequency band level is the most offensive.

For the above-described reasons, it is impossible to perform volume correction suitably by the conventional method in which volume correction is performed using a single condition, i.e., using the low frequency band component alone. As a result, the listener may undesirably experience an odd listening sensation.

SUMMARY OF THE INVENTION

Accordingly, an object of the present invention is to provide an automatic volume correcting method which is capable of performing automatic volume correction using a plurality of conditions in such a manner that the listener does not experience any odd sensation.

Another object of the present invention is to provide an automatic volume correcting device which is capable of automatic volume correction with so the listener does not have the odd sensation, because a plurality of control rules determined from experience are used for determination of the correction as well as providing an automatic volume correcting method.

Another object of the present invention is to provide an automatic volume correcting device capable of automatic volume correction so the listener does not have an odd sensation, by inferring a volume correcting value by fuzzy control on the basis of a plurality of frequency band component levels and a volume set level of a detected sound, as well as providing an automatic volume correcting method.

DETAILED DESCRIPTION OF THE PREFERRED EMBODIMENTS

Figure 1:
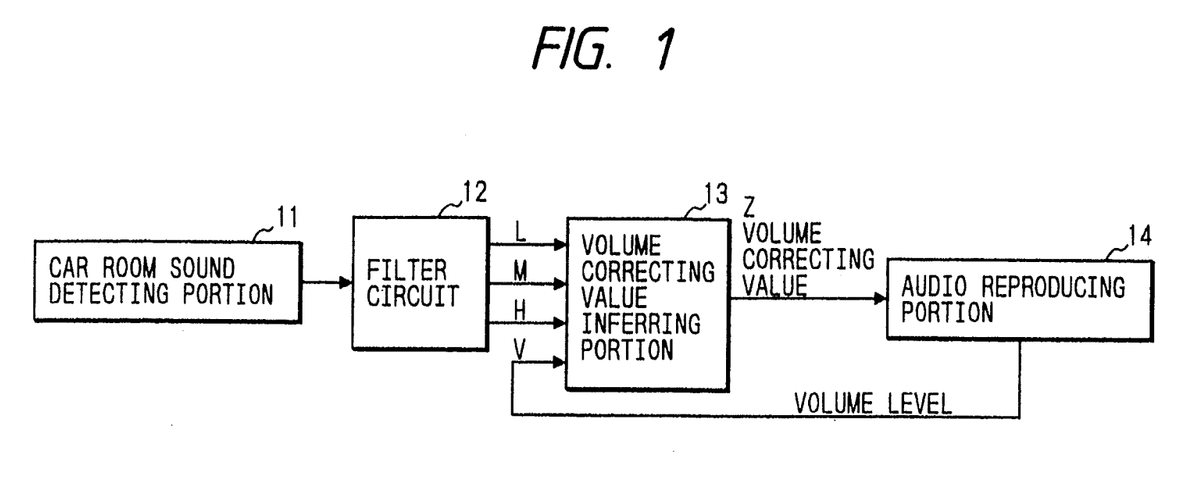
FIG. 1 illustrates the principle of the present invention.

FIG. 1 illustrates the principle of the present invention.

Reference numeral 11 denotes a vehicle compartment sound detecting portion for detecting the sound in a vehicle compartment; 12 denotes a filter circuit for detecting a low frequency band component level, an intermediate frequency band component level, and a high frequency band component level of the detected sound; 13 denotes a volume correcting value inferring portion for inferring the volume correcting value by fuzzy control on the basis of the individual frequency band component levels and a volume level; and 14 denotes an audio reproducing portion.

A plurality of control rules required to infer using fuzzy logic the volume correcting value on the basis of frequency band component levels, L, M and H and a volume level V are stored beforehand in the volume correcting value inferring portion 13. The volume correcting value inferring portion 13 obtains the inference results of the control rules on the basis of the individual frequency band component levels and the volume level, and inputs the weighted mean of the inference results to the audio equipment 14 as a volume correcting value Z to automatically correct the volume. Five control rules may be stored, of which the first control rule is that "if L is large, M–H is large and V is small, then the correcting value is large", the second control rule is that "if L is small, then the correcting value is small", the third control rule is that "if M is small, then the correcting value is small", the fourth control rule is that "if H is large, then the correcting value is small", and the fifth control rule is that "if V is large, then the correcting value is small".

In the present invention, since volume correction is performed by judging each of the plurality of control rules determined from experience, an automatic volume correction so the listener does not have an odd sensation is performed.

Furthermore, since the degree to which each of the control rules is associated with volume correction differs, the coefficients corresponding to the degrees are stored beforehand in the volume correcting value inferring portion 13. The weighted mean of the values obtained by multiplying the inference results by the corresponding coefficients is made the volume correcting value. In this way, automatic volume correction so the listener does not have an odd sensation is performed.

(a) The overall structure

Figure 2:
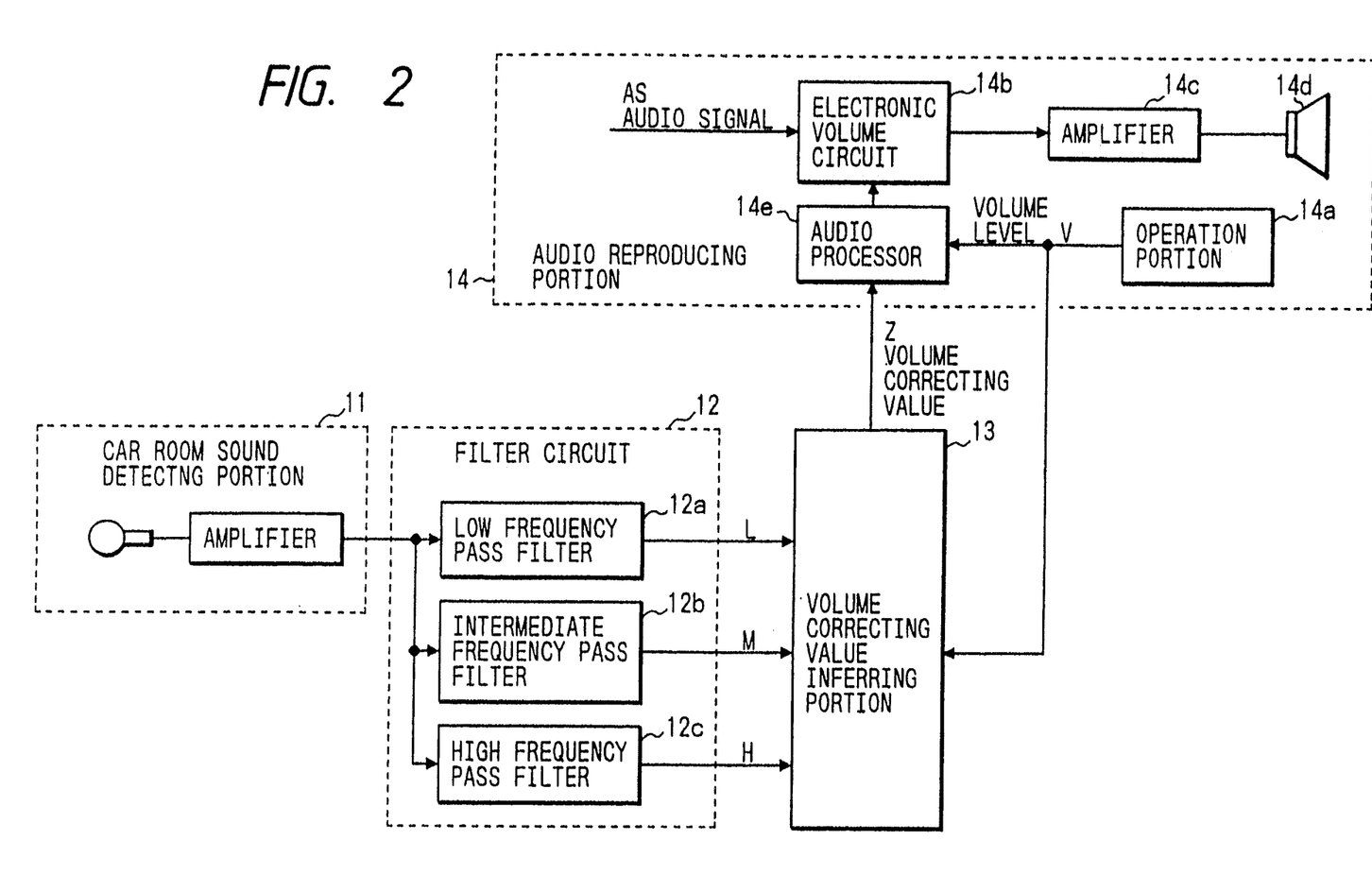
FIG. 2 shows the structure of an embodiment of the present invention.

FIG. 2 shows an embodiment of the present invention. In FIG. 2, reference numeral 11 denotes a vehicle compartment sound detecting portion; 12 a filter circuit for detecting a low frequency band component level L, an intermediate frequency band component level M, and a high frequency band component level H of the detected sound; 13 denotes a volume correcting value inferring portion for inferring a volume correcting value Z by fuzzy control on the basis of the individual frequency band component levels and a set volume level V; and 14 denotes an audio reproducing portion.

The vehicle compartment sound detecting portion 11 includes a microphone 11a for detecting the sound in the vehicle compartment, and an amplifier 11b for amplifying the detection signal.

(b) Filter circuit

Figure 3:
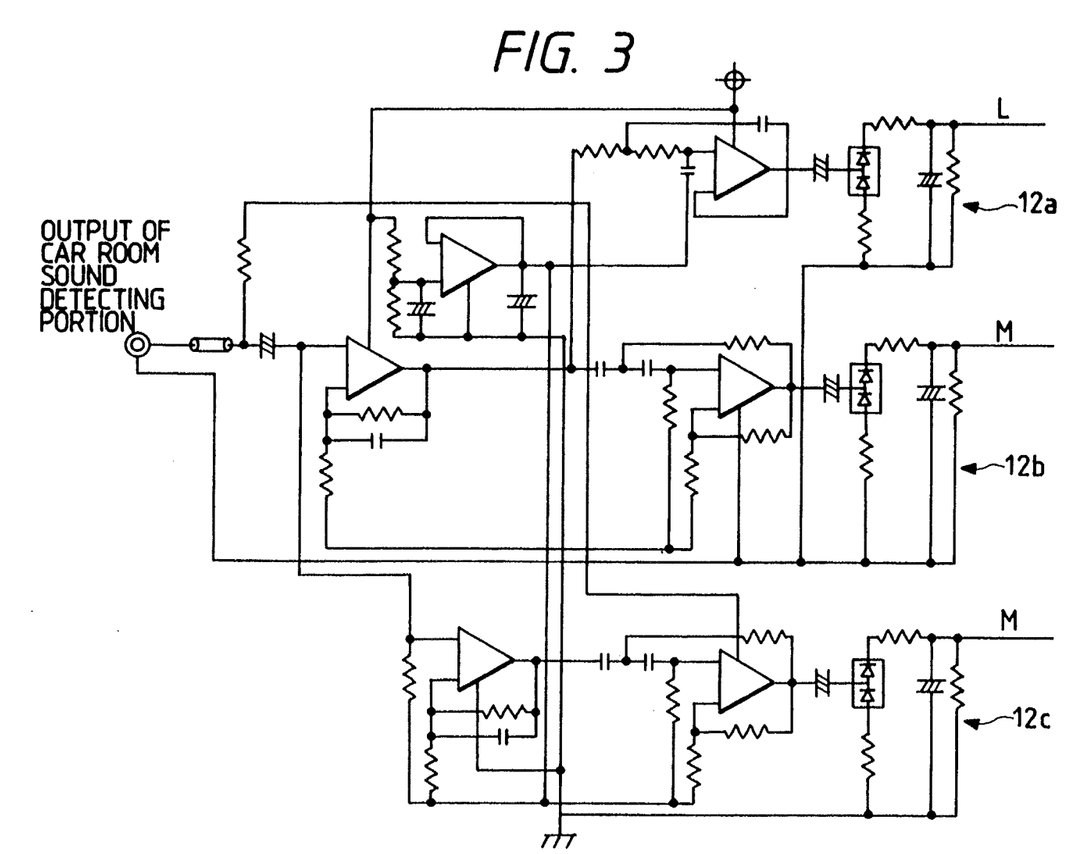
FIG. 3 is a circuit diagram of a three-band type filter.
Figure 4:
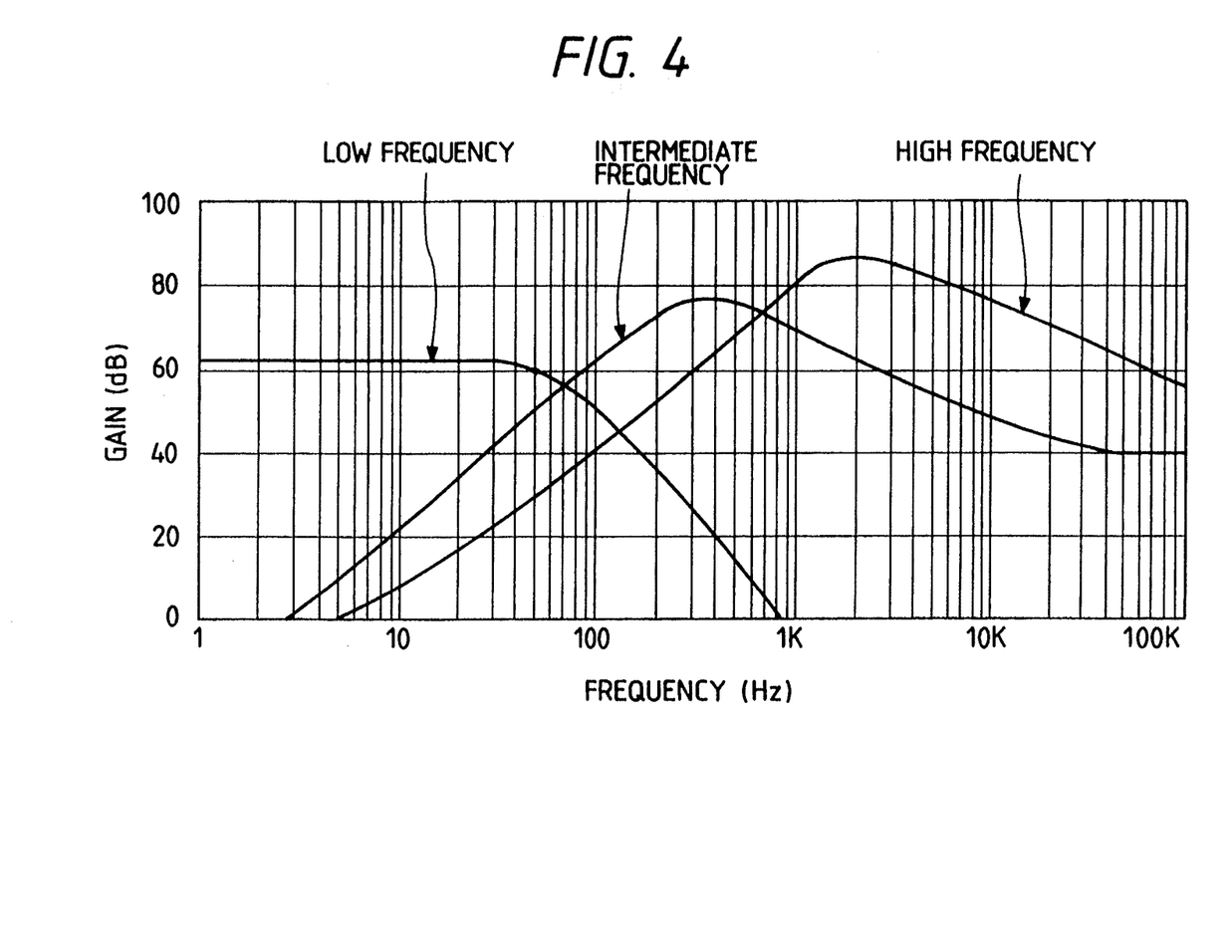
FIG. 4 shows the frequency characteristics of the three-band type filter.

The filter circuit 12 includes a low-pass filter 12a for detecting a low frequency band component level L, an intermediate-pass filter 12b for detecting an intermediate frequency band component level M, and a high-pass filter for detecting a high frequency band component level H. FIG. 3 is a circuit diagram of the filter circuit 12. The filters shown in FIG. 3 have the frequency characteristics shown in FIG. 4.

Because the low frequency band component level is unstable and because there are types of vehicle in which the low frequency band component level increases during idling, the low-pass filter 12a is used to roughly determine whether or not there is noise present.

The intermediate-pass filter 12b cuts off the unstable super low frequency band and also offers comparatively large opposition to intermediate and high frequencies so that it can attenuate music components. Therefore, the passband of the intermediate-pass filter 12b is the intermediate and low frequencies having frequency characteristics relatively close to those of road noises.

The high-pass filter 12c cuts off the low and intermediate frequencies so that it can block or attenuate road noises and engine noises and outputs substantially the music component. Thus, the higher the level of the high-pass filter 12c, the higher the volume level of the music.

(c) Audio reproducing portion

The audio reproducing portion 14 includes an operation portion 14a having various types of operation keys including a volume as well as the display portion, an electronic volume circuit 14b for electronically adjusting the volume of an audio signal AS output from an audio source, such as a tuner, a cassette tape player or a CD player; an amplifier 14c, a speaker 14d, or an audio processor 14e. The audio processor 14e performs various audio control operations, e.g., inputs, to the electronic volume circuit 14b, a volume instruction corresponding to the volume level V, and the volume correcting value Z input from the volume correcting value inferring portion 13 to control correction of the volume on the basis of the volume correcting value Z.

(d) Volume correcting value inferring portion

Reasons for adopting fuzzy control

The volume correcting value inferring portion 13 is designed to determine the volume correcting value by fuzzy control. The reasons to adopt fuzzy control are as follows.

When the driver or the passenger listens to the music in a vehicle compartment, he or she hears the noise corresponding to the value obtained by subtracting the music component from the sound heard in the vehicle compartment. It is impossible to directly measure the level of such noise. If the type of vehicle and that of the audio source are fixed, the noise level may be obtained with a certain degree of accuracy indirectly by providing an adequate sensor and a signal. However, since the audio system is installed in a vehicle after purchase, there is the possibility that the audio system is installed in various types of vehicles and since the noise level changes with the running speed or the like, it is impossible to measure the noise level even indirectly.

There are various types of vehicles and audio systems. Furthermore, how much the volume should be adjusted when there are noises of a certain level is an issue associated with the sense of each individual, and thus differs in each individual.

Thus, the automatic volume system for automatically correcting the volume due to the presence of noises has two fuzzy factors: one, the measurement of the noise level and the other, the determination of the volume correcting quantity.

The purpose of the automatic volume system is defined roughly. For example, it may be to "slightly turn up volume if it is noisy". Therefore, it is possible to make an adequate determination in the automatic volume system by providing an adequate detecting portion and by making a determination with some conditions taken into consideration.

Fuzzy control is a suitable technique to build up such an ambiguous relation from experience. Hence, the volume correcting value inferring portion 13 is designed to determine the volume correcting value by fuzzy control.

Description of fuzzy control

In fuzzy control, a control rule is described as a fuzzy relation between data items x, y associated with the state of an object to be controlled and an input (control input) is the object to be controlled, and the control input z is inferred on the basis of such a control rule. For example, the control rule is described in an if—then form as follows:

if x is small and y is big, then z is small
if x is big and y is small, then z is big The result of the inference by each of the control rules is obtained, and the weighted mean of the inference results is inferred as a control input. In the control rule, the portion stating if . . . is called a front conditional portion, the portion stating then . . . is called a rear conditional portion, variables x and y are called inputs, and z is called an output.

Figure 5A:
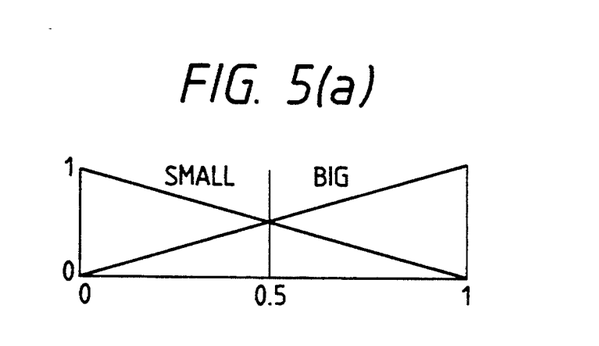
FIGS. 5(a), 5(b), 5(c) illustrate a fuzzy control.
Figure 5B:
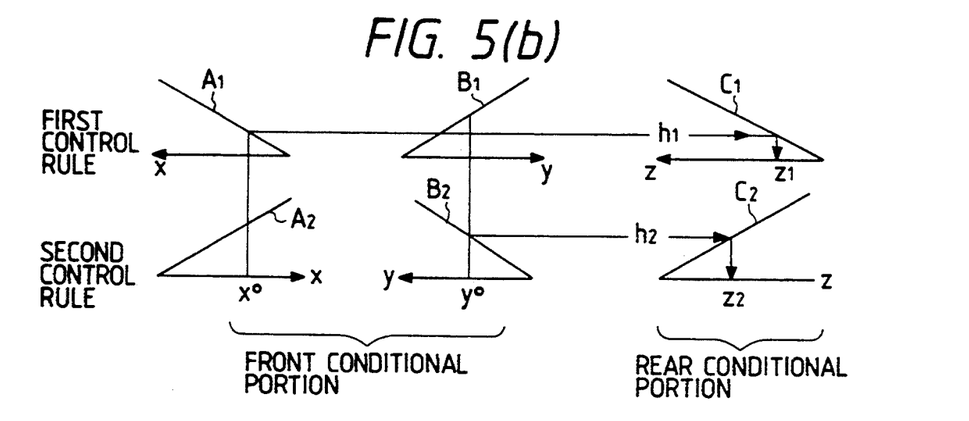

Assuming that the membership functions which express fuzzy sets of ". . . is big", ". . . is small" are indicated using a straight line, as shown in FIG. 5(a), the membership functions $A_1$, $B_1$ and $C_1$ which express fuzzy sets of "x is small", "y is big", and "z is small" in the front and rear conditional portions of the first control rule are indicated in the manner shown in FIG. 5(b). The membership functions $A_2$, $B_2$ and $C_2$ which express fuzzy sets of "x is big", "y is small", and "z is big" in the front and rear conditional portions of the second control rule are also indicated in the manner shown in FIG. 5(b).

To infer the output z when $x=x^0$ and $y=y^0$, adaptations $h_1$ and $h_2$ with which the inputs ($x=x^0$ and $y=y^0$) are adapted to the front conditional portions of the first and second control rules are obtained. If there is a single condition, the adaptation is a membership value which changes according to the input. If there are two conditions in the front conditional portions of both the first and second control rules, the entire adaptation is the product of the respective membership values and is given by the following expression:

$$h_1 = A_1(x^0) * B_1(y^0)$$

$$h_2 = A_2(x^0) * B_2(y^0)$$

where * indicates the "min" operation or an algebraic product.

The adaptations $h_1$ and $h_2$ and the inference results $z_1$ and $z_2$ in the respective control rules have the following relations:

$$h_1 = C_1(z_1)$$

$$h_2 = C_2(z_2)$$

The entire inference result z can be obtained as follows by obtaining the weighted mean of $z_1$ and $z_2$.

$$z = (h_1 z_1 + h_2 z_2)/(h_1 + h_2) \quad (1)$$

When there are n control rules, the entire inference result z is generally obtained by the following equation:

$$z = (h_1 z_1 + h_2 z_2 + \ldots + z_n h_n)/(h_1 + h_2 + \ldots + h_n) \quad (2)$$

Figure 5C:
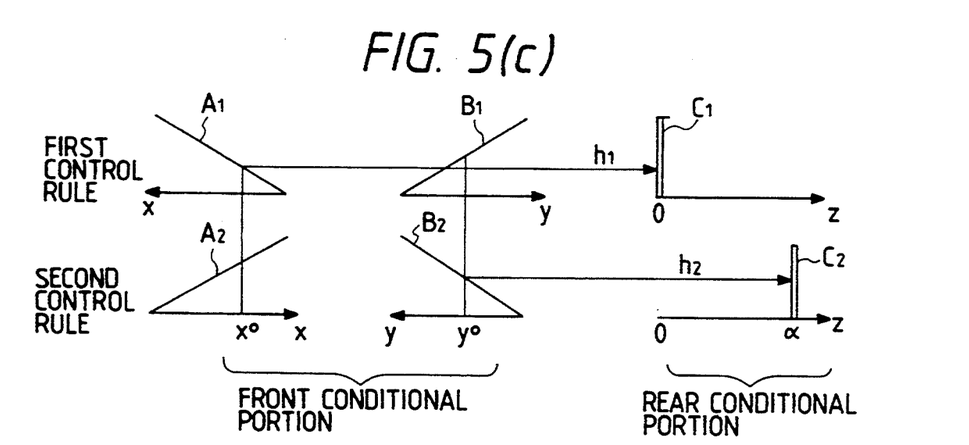

In the simplified method in which the rear conditional portion is not expressed by a membership function but a constant, when the rear conditional portion of the first control rule "z is small" is expressed by a constant (which is 0) and when the rear conditional portion of the second control rule "z is big" is expressed by a constant $\alpha$ (see FIG. 5(c)), $z_1 = 0$ from the first control rule and $z_2 = \alpha$ from the second control rule. The entire inference result z is obtained by the following equation:

$$z = h_2 \cdot \alpha /(h_1 + h_2) \quad (3)$$

Control rule in automatic volume control

Although various control rules and membership functions can be set to infer the volume correcting value by fuzzy control, the number of control rules must be reduced as much as possible and the membership functions must be made simple. Automatic volume control is stated from experience as follows:

(1) It is estimated that the higher the low frequency band component level, the higher the noise level, and the correcting value is increased. However, this estimation is not very reliable due to the vehicle's vibrations. In contrast, when the low frequency band component level is low, the correcting value is reduced. This estimation is highly reliable.

(2) It is estimated that when the intermediate frequency band component level is high as compared with the high frequency band component level, the noise level is high, and the correcting value is increased. In contrast, when the intermediate frequency band component level is low, the correcting value is reduced.

(3) It is estimated that the smaller the volume set value, the lower the loudness of music. Since the music is not heard well in the presence of noise, the correcting value is increased. In contrast, when the volume set value is large, the correcting value is reduced.

(4) It is estimated that the lower the intermediate frequency band component level, the less the loudness of both music and noise, and the correcting value is not increased much. In contrast, when the intermediate frequency band component level is high, it is impossible to determine whether it is music or noise that is heard. Therefore, no rule exists regarding volume correction.

(5) It is estimated that the higher the high frequency band component level, the higher the loudness of music, and the correcting value is thus reduced. In contrast, it is estimated that the lower the high frequency band component level, the less the loudness of the music. However, no data on noise is obtained. Therefore, no rule exists regarding correction.

Table 1 shows the control rules created on the basis of the above-described statements. In the table, L indicates a low frequency band component level, M indicates an intermediate frequency band component level, H indicates a high frequency band component level, and V indicates a volume level.

TABLE 1

| | |
|---|---|
| Control rule 1 | If L is large, M-H is large and V is small, then z is large. |
| Control rule 2 | If L is small, then z is small |
| Control rule 3 | If M is small, then z is small. |
| Control rule 4 | If H is large, then z is small |
| Control rule 5 | If V is large, then z is small. |

Structure of the volume correcting value inferring portion

Figure 6:
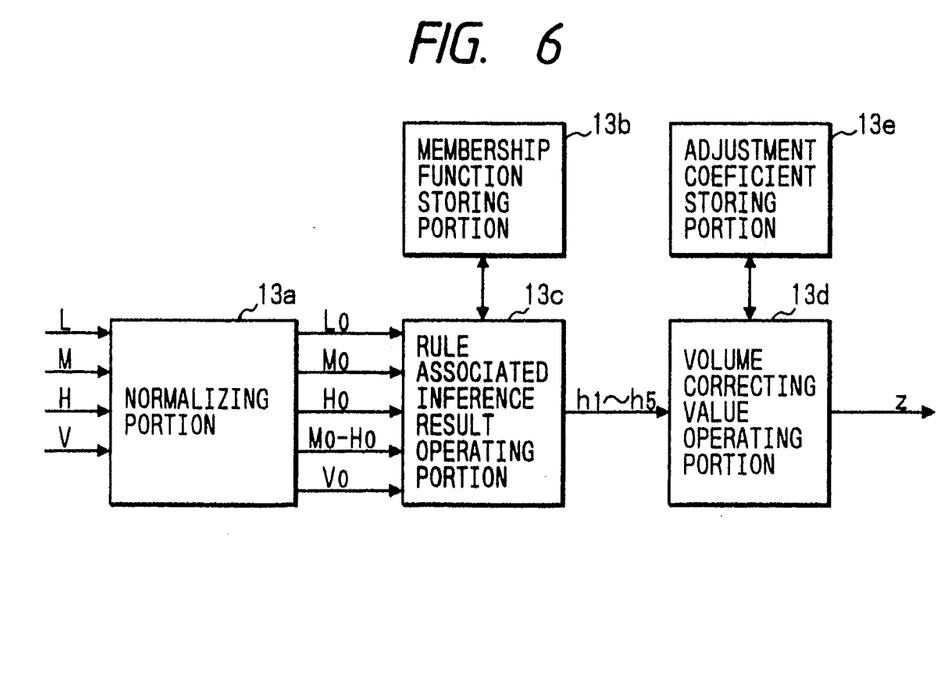
FIG. 6 shows the structure of a volume correcting value inferring portion.

FIG. 6 shows the structure of the volume correcting value inferring portion 13 for inferring the volume correcting value by fuzzy control. A normalization portion 13a normalizes the low frequency band component level L, the intermediate frequency band component level M, the high frequency band component level H and the volume level V having 36 steps from 0 to 35, which are expressed in 8 bits (0 to 255), or as a value ranging from 0 to 15 (having 4 bits). That is, the normalization portion 13a performs normalization by the following equations:

$$L_0 = L \cdot 1.25/16$$

$$M_0 = M/16$$

$$H_0 = H/16$$

$$(M_0 - H_0) = (M-H)/16$$

$$V_0 = V \cdot 8/16$$

The low frequency band component level L is normalized by multiplying it by 1.25 for the following reasons: in the audio equipment, the volume set in the range of $-0$ dB to infinity is handled as one factor which expresses the volume of music. The volume becomes a maximum value before it is reduced to −0 dB. After it has become the maximum value, it is distorted. Therefore, a subsequent membership function must be increased at an early time.

Figure 7:
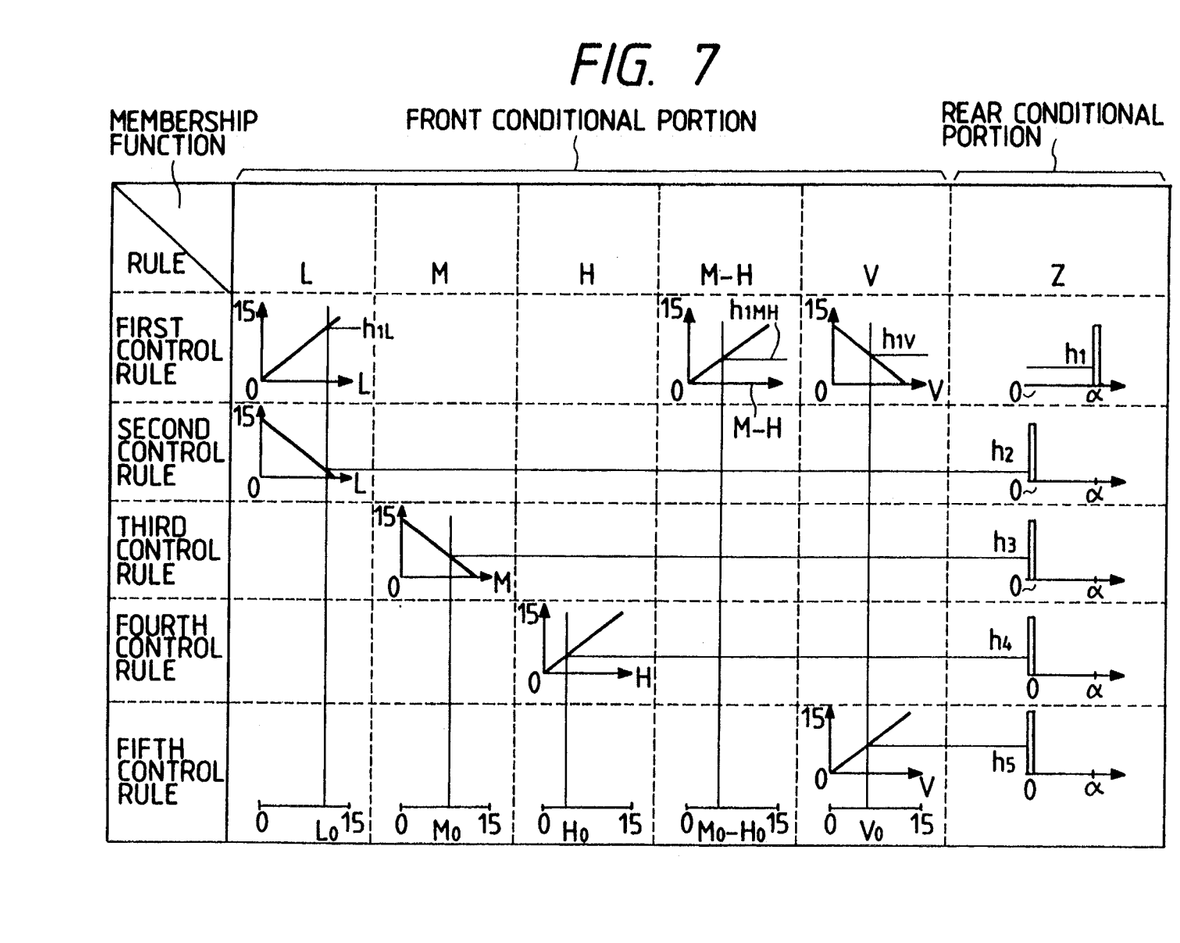
FIG. 7 illustrates a membership function.

A membership function storing portion 13b stores the membership functions in each of the control rules shown in Table 1. The membership functions in the front conditional portion are expressed using a straight line, as shown in FIG. 5(a), while the membership functions in the rear conditional portion are expressed by a constant 0 (which ... is small) and by a constant $\alpha$ (when ... is large). FIG. 7 is a graphic representation of the membership functions in the first through fifth control rules. The adaptation is expressed by one value ranging from 0 to 15. The rear conditional portion may also be expressed using a straight line.

A rule associated inference result operating portion 13c obtains inference results $h_1$ through $h_5$ corresponding to the first through fifth control rules. Since the membership functions are expressed using a straight line, the input values have a value ranging from 0 to 15, and the adaptation has a value ranging from 0 to 15, the straight line has an inclination of 45°. In other words, the adaptation of the membership function (whose inclination increases in a rightward direction) corresponding to the condition which reads "... is large" is the input value itself, and the adaptation of the membership function (whose inclination decreases in a rightward direction) corresponding to the condition which reads "... is small" is (maximum value−input value) (which is 15 at a maximum).

As a result, the adaptations $h_{1L}$, $h_{1MH}$ and $h_{1V}$ of the membership functions in the first control rule are given by:

$$h_{1L} = L_1$$

$$h_{1MH} = M_0 - H_0$$

$$h_{1V} = 15 - V_0$$

The inference result $h_1$ is given by the following equation:

$$h_1 = H_{1L} \cdot h_{1MH} \cdot h_{1V}/256 \tag{4a}$$

Division by 256 is performed to allow the membership function value to be expressed in 4 bits, i.e., to allow it to have a value ranging from 0 to 15.

The adaptations $h_2$, $h_3$, $h_4$ and $h_5$ of the second through fifth control rules are given by:

$$h_2 = 15 - L_0 \tag{4b}$$

$$h_3 = 15 - M_0 \tag{4c}$$

$$h_4 = H_0 \tag{4d}$$

$$h_5 = V_0 \tag{4e}$$

These $h_2$, $h_3$, $h_4$ and $h_5$ become the inference results of the second through fifth control rules.

Thus, the rule associated inference result operating portion 13c operates the inference results $h_1$ through $h_5$ in the first through fifth control rules on the basis of the equations (4a) through (4e).

The audio reproducing portion 14 further includes a volume correcting value operating portion 13d, and an adjustment coefficient storing portion for storing adjustment coefficients $\beta_1$ through $\beta_5$. The volume correcting value operating portion 13 operates the volume correcting value z by the following equation:

$$z = \alpha \cdot h_1/(h_1 + h_2 + h_3 + h_4 + h_5) \tag{5}$$

Equation (5) can be obtained in the form of equation (3).

If the simplified method is not employed, the volume correcting value z is given by the following equation:

$$z = (\alpha_1 h_1 + \alpha_2 h_2 + \alpha_3 h_3 + \alpha_4 h_4 + \alpha_5 h_5)/(h_1 + h_2 + h_3 + h_4 + h_5) \tag{6}$$

Equation (6) is apparent from equation (2). In equation (6), $\alpha_i$ (i=1 to 5) is a value which satisfies $C_i(\alpha_i) = h_i$ where $C_i(z)$ is the membership function of each of the control rules.

The degree with which each of the control rules is associated with volume correction differs. Therefore, to finely adjust the volume correcting value with such a degree taken into consideration, adjustment coefficients $\beta_1$, $\beta_2$, $\beta_3$, $\beta_4$ and $\beta_5$ corresponding to the degrees with which the individual control rules are associated with volume correction are predetermined (in an actual operation, $\beta_2$ through $\beta_5$ are determined under the condition that $\beta_1 = 16$ (at a maximum)). In the simplified method, the volume correcting value z is operated as:

$$z = \alpha \beta_1 h_1/(\beta_1 h_1 + \beta_2 h_2 + \beta_3 h_3 + \beta_4 h_4 + \beta_5 h_5) \tag{5'}$$

In the simplified method is not employed, the volume correcting value z is given as:

$$z = (\alpha_1 \beta_1 h_1 + \alpha_2 \beta_2 h_2 + \alpha_3 \beta_3 h_3 + \alpha_4 \beta_4 h_4 + \alpha_5 \beta_5 h_5)/(\beta_1 h_1 + \beta_2 h_2 + \beta_3 h_3 + \beta_4 h_4 + \beta_5 h_5) \tag{6'}$$

(e) The operation of the entire system

The entire system is operated in the manner described below. It is assumed that the first through fifth control rules required to infer the volume correcting value on the basis of the individual frequency band component levels L, M, H and the volume level V are stored beforehand in the membership function storing portion 13b of the volume correcting value inferring portion 13.

The compartment sound detecting portion 11 detects the sound level in a vehicle compartment and inputs the detected level to the filter circuit 12. The low-, intermediate- and high-pass filters 12a through 12c of the filter circuit 12 respectively detect the low frequency band component level L, the intermediate frequency band component level M and the high frequency band component level H, and input the detected levels to the volume correcting value inferring portion 13. The volume level V set by the operation portion 14a is also input to the volume correcting value inferring portion 13.

In the volume correcting value inferring portion 13, the rule associated inference result operating portion 13c normalizes the input L, M, H and V, and then operates the inference results $h_1$ through $h_5$ in the first through fifth control rules on the basis of equations (4a) through (4e).

Thereafter, the volume correcting value operating portion 13d operates the volume correcting value z from equation (5) or (6) or alternatively from (5') or (6') when the adjustment coefficient is taken into consideration, and inputs the calculated volume correcting value z to the audio processor 14e of the audio reproducing portion 14 for volume correction.

While a preferred embodiment has been described, it is to be understood that various modifications may be made therein without departing from the spirit and scope of the following claims.

The present invention can be applied not only to audio equipment but also to all types of electronic apparatus for vehicles which have an audio reproduction portion, such as a composite product which may be a combination of audio equipment, such as an onboard TV receiver, and another device.

As will be understood from the foregoing description, in the present invention, a plurality of control rules required to infer the volume correcting value on the basis of the respective frequency band component levels, L, M and H and the volume level V are stored beforehand. The inference results of the individual control rules are obtained on the basis of the individual frequency band component levels and the volume level, and the weighted mean of the respective inference results is input to the audio equipment as the volume correcting value Z for automatic volume correction. Thus, volume correction can be performed with the plurality of control rules determined from experience taken into consideration, and an automatic volume control operation so the listener does not have an odd sensation can thus be obtained.

Furthermore, in the present invention, since the degree with which each of the control rules is associated with volume correction differs, the adjustment coefficients corresponding to the individual degrees are stored, and the weighted mean of the values obtained by multiplying the inference results of the control rules by the corresponding adjustment coefficients is made the volume correcting value. As a result, automatic volume correction so the listener does not further have an odd sensation can be provided.

What is claimed is:

1. An automatic volume control device for use with an electronic apparatus, said device comprising:
   a sound detection portion for detecting sound having a volume level;
   a filter circuit for detecting a plurality of frequency band component levels from the detected sound;
   a volume correcting value inferring portion for storing a plurality of control rules and for inferring a volume correcting value from the control rules as a function of the frequency band component levels and the volume level; and
   an audio reproducing portion for automatically correcting a volume of the electronic apparatus in response to the inferred volume correcting value; wherein said volume correcting value inferring portion obtains inference results of each of the control rules as a function of the frequency band component levels and the volume level, and produces a weighted mean of the inference results as the volume correcting value.

2. An automatic volume control device according to claim 1, wherein said volume correcting value inferring portion further comprises:
   an adjustment coefficient storing portion for storing an adjustment coefficient corresponding to a degree with which each of the control rules is associated with volume control; and
   a volume correcting value adjusting portion for adjusting the volume correcting value based upon the magnitude of the adjustment coefficients.

3. An automatic volume control device for use with audio equipment, said automatic volume control device comprising:
   a sound detection portion for detecting sound having a volume level;
   a filter circuit for detecting frequency band component levels from the detected sound;
   a volume correcting value inferring portion for storing a plurality of control rules, for obtaining the inference result of each of the control rules as a function of the frequency band component levels and the volume level, and for inferring a weighted mean of the inference results as a volume correcting value, the volume correcting value inferring portion further including a normalizing portion for normalizing each of the frequency band component levels and the volume level; and
   an audio reproducing portion for automatically correcting a volume of the audio equipment in response to the inferred volume correcting value.

4. An automatic volume control device for use with audio equipment, said automatic volume control device comprising:
   a sound detection portion for detecting sound having a volume level;
   a filter circuit for detecting frequency band component levels from the detected sound;
   a volume correcting value inferring portion for storing a plurality of control rules, for obtaining the inference result of each of the control rules as a function of the frequency band component levels and the volume level, and for inferring a weighted mean of the inference results as a volume correcting value, wherein:
      a coefficient corresponding to a degree with which each of the control rules is associated with volume correcting value is stored in said volume correcting value inferring portion beforehand; and
      inferring the weighted mean of the inference results includes multiplying the inference results of the control rules by the corresponding coefficients; and
   an audio reproducing portion for automatically correcting a volume of the audio equipment in response to the inferred volume correcting value.

5. An automatic volume control device according to claim 4, wherein said volume correcting value inferring portion further comprises:
   a normalizing portion for normalizing the individual frequency band component levels and the volume level;
   a membership function storing portion for storing a membership function or functions associated with each of the control rules;
   a rule associated inference result operating portion for producing the inference result according to each of the control rules;
   an adjustment coefficient storing portion for storing an adjustment coefficient corresponding to a degree with which each of the control rules is associated with volume control; and
   a volume correcting value adjusting portion for adjusting the volume correcting value based upon the magnitude of the adjustment coefficients.

6. An automatic volume control device for use with an electronic apparatus, said device comprising:

a sound detection portion for detecting sound having a volume level;

a filter circuit for detecting a plurality of frequency band component levels from the detected sound;

a volume correcting value inferring portion for storing a plurality or control rules and for inferring a volume correcting value from the control rules as a function of the frequency band component levels and the volume level; and an audio reproducing portion for automatically correcting a volume of the electornic apparatus in response to the inferred volume correcting value;

wherein said filter circuit detects a low frequency band component level, an intermediate frequency band component level and a high frequency band component level of the detected sound; and wherein one of the control rules is that if the low frequency band component level is large, if the intermediate frequency band component level is much larger than the high frequency band component level and if the volume level is small, then the volume correcting value is large.

7. An automatic volume control device for use with an electronic apparatus, said device comprising:

a sound detection portion for detecting sound having a volume level;

a filter circuit for detecting a plurality of frequency band component levels from the detected sound;

a volume correcting value inferring portion for storing a plurality of control rules and for inferring a volume correcting value from the control rules as a function of the frequency band component levels and the volume level; and an audio reproducing portion for automatically correcting a volume of the electronic apparatus in response to the inferred volume correcting value;

wherein said filter circuit detects a low frequency band component level, an intermediate frequency band component level and a high frequency band component level of the detected sound; and wherein one of the control rules is that if the low frequency band component level is small, then the volume correcting value is small.

8. An automatic volume control device for use with an electronic apparatus, said device comprising:

a sound detection portion for detecting sound having a volume level;

a filter circuit for detecting a plurality of frequency band component levels from the detected sound;

a volume correcting value inferring portion for storing a plurality of control rules and for inferring a volume correcting value from the control rules as a function of the frequency band component levels and the volume level; and an audio reproducing portion for automatically correcting a volume of the electronic apparatus in response to the inferred volume correcting value;

wherein said filter circuit detects a low frequency band component level, an intermediate frequency band component level and a high frequency band component level of the detected sound; and wherein one of the control rules is that if the intermediate frequency band component level is small, then the volume correcting value is small.

9. An automatic volume control device for use with an electronic apparatus, said device comprising:

a sound detection portion for detecting sound having a volume level;

a filter circuit for detecting a plurality of frequency band component levels from the detected sound;

a volume correcting value inferring portion for storing a plurality of control rules and for inferring a volume correcting value from the control rules as a function of the frequency band component levels and the volume level; and an audio reproducing portion for automatically correcting a volume of the electronic apparatus in response to the inferred volume correcting value;

wherein said filter circuit detects a low frequency band component level, an intermediate frequency band component level and a high frequency band component level of the detected sound;

and wherein:

a first control rule is that if the low frequency band component level is large, the intermediate frequency band component level is much larger than the high frequency band component level, and the volume level is small, then the volume correcting value is large;

a second control rule is that if the low frequency band component level is small, then the volume correcting value is small;

a third control rule is that if the intermediate frequency band component level is small, then the volume correcting value is small;

a fourth control rule is that if the high frequency band component level is large, then the volume correcting value is small; and a fifth control rule is that if the volume level is large, then the volume correcting value is small.

10. A method for automatically correcting volume of audio equipment, said method comprising the steps of:

detecting sound;

filtering a plurality of frequency band component levels from the detected sound;

storing a plurality of control rules;

obtaining inference results of the control rules as a function of the frequency band component levels and the volume level;

calculating a weighted mean of the inference results as a volume correcting value; and correcting the volume of the audio equipment in response to the volume correcting value;

wherein the step of making the weighted mean of the inference results as the volume correcting value further comprises the steps of:

storing a coefficient corresponding to a degree with which each of the control rules is associated with the volume correcting value;

multiplying the inference results of the control rules by the corresponding coefficients; and using the weighted mean of the values obtained by the multiplications as the volume correcting value.

11. A method for automatically correcting volume of audio equipment, said method comprising the steps of:

detecting sound;

filtering a plurality of frequency band component levels from the detected sound;

storing a plurality of control rules;

obtaining interference results of the control rules as a function of the frequency band component levels and the volume level;

calculating a weighted mean of the inference results as a volume correcting value; and correcting the volume of the audio equipment in response to the volume correcting value;

wherein the plurality of frequency band component levels includes a low frequency band component level, an intermediate frequency band component level and a high frequency band component level; and wherein a first control rule is that if the low frequency band component level is large, the intermediate frequency band component level is much larger than the high frequency band component level and the volume level is small, then the volume correcting value is large;

a second control rule is that if the low frequency band component level is small, then the volume correcting value is small;

a third control rule is that if the intermediate frequency band component level is small, then the volume correcting value is small;

a fourth control rule is that if the high frequency band component level is large, then the volume correcting value is small; and a fifth control rule is that if the volume level is large, then the volume correcting value is small.

* * * * *